US009553255B2

(12) United States Patent
Uchida et al.

(10) Patent No.: US 9,553,255 B2
(45) Date of Patent: Jan. 24, 2017

(54) MEMORY ELEMENT, MEMORY APPARATUS

(71) Applicant: Sony Corporation, Tokyo (JP)

(72) Inventors: Hiroyuki Uchida, Kanagawa (JP); Masanori Hosomi, Tokyo (JP); Hiroyuki Ohmori, Kanagawa (JP); Kazuhiro Bessho, Kanagawa (JP); Yutaka Higo, Kanagawa (JP); Tetsuya Asayama, Tokyo (JP); Kazutaka Yamane, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 67 days.

(21) Appl. No.: 14/358,645

(22) PCT Filed: Oct. 31, 2012

(86) PCT No.: PCT/JP2012/006976
§ 371 (c)(1),
(2) Date: May 15, 2014

(87) PCT Pub. No.: WO2013/080436
PCT Pub. Date: Jun. 6, 2013

(65) Prior Publication Data
US 2014/0319521 A1 Oct. 30, 2014

(30) Foreign Application Priority Data

Nov. 30, 2011 (JP) .................. 2011-261854

(51) Int. Cl.
H01L 43/02 (2006.01)
H01L 27/22 (2006.01)
(Continued)

(52) U.S. Cl.
CPC ............. H01L 43/02 (2013.01); G01R 33/093 (2013.01); G11B 5/3909 (2013.01);
(Continued)

(58) Field of Classification Search
USPC .......................................................... 438/3
See application file for complete search history.

(56) References Cited

U.S. PATENT DOCUMENTS 6,256,223 B1   7/2001  Sun
2008/0094886 A1 * 4/2008 Ranjan ................. B82Y 10/00
                                               365/171
(Continued)

FOREIGN PATENT DOCUMENTS

JP  2003-017782  1/2003
JP  2008-010590  1/2008
(Continued)

OTHER PUBLICATIONS

Mangin, S., et al.,"Current-induced magnetization reversal in nanopillars with perpendicular anisotropy", Natural Material., vol. 5, pp. 210-215, Mar. 2006.
(Continued)

Primary Examiner — Yu Chen
Assistant Examiner — Nilufa Rahim
(74) Attorney, Agent, or Firm — Dentons US LLP

(57) ABSTRACT

A memory element includes a memory layer having magnetization perpendicular to a film face of the memory layer in which a direction of the magnetization configured to be changed. The memory element includes a magnetization-fixed layer having a magnetization perpendicular to the film face. The memory element includes an intermediate layer that is formed of a non-magnetic material and is provided between the memory layer and the magnetization-fixed layer. The memory layer includes a multilayer structure in which a non-magnetic material and an oxide are laminated. The direction of the magnetization of the memory layer is
(Continued)

configured to be changed by applying a current in a lamination direction of the layered structure to record information in the memory layer.

14 Claims, 7 Drawing Sheets

(51) Int. Cl.
| | | |
|---|---|---|
| *H01L 27/24* | (2006.01) | |
| *H01L 43/08* | (2006.01) | |
| *H01L 43/10* | (2006.01) | |
| *G11B 5/39* | (2006.01) | |
| *G01R 33/09* | (2006.01) | |
| *G11C 11/16* | (2006.01) | |

(52) U.S. Cl.
CPC .......... *H01L 27/222* (2013.01); *H01L 27/224* (2013.01); *H01L 27/226* (2013.01); *H01L 27/228* (2013.01); *H01L 27/2481* (2013.01); *H01L 43/08* (2013.01); *H01L 43/10* (2013.01); *G11C 11/16* (2013.01)

(56) References Cited

U.S. PATENT DOCUMENTS

| | | | |
|---|---|---|---|
| 2011/0064969 A1* | 3/2011 | Chen et al. | 428/800 |
| 2012/0018823 A1* | 1/2012 | Huai et al. | 257/421 |
| 2012/0063218 A1* | 3/2012 | Huai et al. | 365/171 |
| 2012/0146167 A1* | 6/2012 | Huai et al. | 257/421 |
| 2012/0206958 A1* | 8/2012 | Zhou | H01L 43/02 365/171 |
| 2012/0218805 A1* | 8/2012 | Kim et al. | 365/63 |
| 2013/0075837 A1* | 3/2013 | Chen et al. | 257/421 |

FOREIGN PATENT DOCUMENTS

| | | |
|---|---|---|
| JP | 2008-227388 | 9/2008 |
| JP | 2009-094104 | 4/2009 |
| JP | 2011-061204 | 3/2011 |

OTHER PUBLICATIONS

Slonczewski, J.C., "Curent-driven excitation of magnetic multilayers", Journal of Magnetism and Magnetic Materials, vol. 159, 1996.
Berger, L., "Emission of spin waves by a magnetic multilayer traversed by a current", Physical Review B., vol. 54, No. 13, Oct. 1, 1996 pp. 9353-9358.

\* cited by examiner

A

B

MEMORY ELEMENT, MEMORY APPARATUS

TECHNICAL FIELD

The present disclosure relates to a memory element and a memory apparatus that have a plurality of magnetic layers and make a record using a spin torque magnetization inversion.

BACKGROUND ART

Along with a rapid development of various information apparatuses from mobile terminals to large capacity servers, further high performance improvements such as higher integration, increases in speed, and lower power consumption have been pursued in elements such as a memory and a logic configuring this. In particular, a semiconductor non-volatile memory has significantly progressed, and, as a large capacity file memory, a flash memory is spreading at such a rate that hard disk drives are replaced with the flash memory. Meanwhile, the development of FeRAM (Ferro-electric Random Access Memory), MRAM (Magnetic Random Access Memory), PCRAM (Phase-Change Random Access Memory), or the like has progressed as a substitute for the current NOR flash memory, DRAM or the like in general use, in order to use them for code storage or as a working memory. A part of these is already in practical use.

Among them, the MRAM performs the data storage using a magnetization direction of a magnetic material, so that high speed and nearly unlimited ($10^{15}$ times or more) rewriting can be made, and therefore has already been used in fields such as industrial automation and an airplane. The MRAM is expected to be used for code storage or a working memory in the near future due to the high-speed operation and reliability. However, it has challenges related to lowering power consumption and increasing capacity actually. This is a basic problem caused by the recording principle of the MRAM, that is, the method of inverting the magnetization using a current magnetic field generated from an interconnection.

As a method of solving this problem, a recording method not using the current magnetic field, that is, a magnetization inversion method, is under review. In particular, research on a spin torque magnetization inversion has been actively made (see, for example, Patent Documents 1, 2, and 3, and Non-Patent Documents 1 and 2).

The memory element using a spin torque magnetization inversion often includes an MTJ (Magnetic Tunnel Junction) element and TMR (Tunneling Magnetoresistive) element, similarly to the MRAM.

This configuration uses a phenomenon in which, when spin-polarized electrons passing through a magnetic layer which is fixed in an arbitrary direction enter another free (the direction is not fixed) magnetic layer, a torque (which is also called as a spin transfer torque) is applied to the magnetic layer, and the free magnetic layer is inverted when a current having a predetermined threshold value or more flows. The rewriting of 0/1 is performed by changing the polarity of the current.

An absolute value of a current for the inversion is 1 mA or less in the case of an element with a scale of approximately 0.1 μm. In addition, because this current value decreases in proportion to a volume of the element, scaling is possible. Furthermore, because a word line necessary for the generation of a recording current magnetic field in the MRAM is not necessary, there is an advantage that a cell structure becomes simple.

Hereinafter, the MRAM utilizing a spin torque magnetization inversion will be referred to as ST-MRAM (Spin Torque-Magnetic Random Access Memory). The spin torque magnetization inversion is also referred to as spin injection magnetization inversion. Great expectations are placed on the ST-MRAM as a non-volatile memory capable of realizing lower power-consumption and larger capacity while maintaining the advantages of the MRAM in which high speed and nearly unlimited rewriting may be performed.

CITATION LIST

Patent Document

Patent Document 1: Japanese Unexamined Patent Application Laid-open No. 2003-17782
Patent Document 2: U.S. Pat. No. 6,256,223
Patent Document 3: Japanese Unexamined Patent Application Laid-open No. 2008-227388

Non-Patent Document

Non-Patent Document 1: Physical Review B, 54, 9353 (1996)
Non-Patent Document 2: Journal of Magnetism and Magnetic Materials, 159, L1 (1996)
Non-Patent Document 3: Nature Materials., 5, 210 (2006)

DISCLOSURE OF THE INVENTION

Problem to be Solved by the Invention

Although various materials are considered as a ferromagnetic material used for the memory element of the ST-MRAM, a material having a perpendicular magnetic anisotropy is generally regarded as suitable for lower power-consumption and larger capacity as compared with a material having an in-plane magnetic anisotropy. This is because the perpendicular magnetization has a lower threshold value that should be exceeded during a spin torque magnetization inversion and a perpendicular magnetization film has a high magnetic anisotropy that is advantageous for holding the thermal stability of the memory element miniaturized by the increase in capacity.

Meanwhile, in order to realize a memory element with a high density, it is essential to hold a record stably at a low current. However, a memory element having a perpendicular magnetic anisotropy generally has been known to have a high damping constant that contributes to a recording current, and therefore are disadvantageous for decreasing the recording current.

In view of the above, it is an object of the present disclosure to propose a relatively easy method of improving magnetic properties and decreasing a recording current, and to provide a memory element that is capable of making a record stably at a low current as the ST-MRAM.

Means for Solving the Problem

A memory element of the present disclosure includes a layered structure including a memory layer having magnetization perpendicular to a film face in which a direction of the magnetization is changed depending on information, a magnetization-fixed layer having magnetization perpendicular to the film face, which becomes a base of the information stored in the memory layer, and an intermediate layer that is formed of a non-magnetic material and is provided between the memory layer and the magnetization-fixed layer. Then, the memory layer includes a multilayer structure layer in which a non-magnetic material and an oxide are laminated, and the direction of the magnetization of the memory layer is changed by applying a current in a lamination direction of the layered structure to record the information in the memory layer.

Moreover, a memory apparatus of the present disclosure includes a memory element that holds information based on a magnetization state of a magnetic material, the memory element including a layered structure including a memory layer having magnetization perpendicular to a film face in which a direction of the magnetization is changed depending on information, the direction of the magnetization of the memory layer being changed by applying a current in a lamination direction of the layered structure to record the information in the memory layer, the memory layer including a multilayer structure layer in which a non-magnetic material and an oxide are laminated, a magnetization-fixed layer having magnetization perpendicular to the film face, which becomes a base of the information stored in the memory layer, and an intermediate layer that is formed of a non-magnetic material and is provided between the memory layer and the magnetization-fixed layer, and two types of interconnections intersecting with each other. Then, the memory layer is disposed between the two types of interconnections, and the current in the lamination direction is applied to the memory element through the two types of interconnections.

According to the memory element of the present disclosure, because it includes a memory layer that holds information based on a magnetization state of a magnetic material, a magnetization-fixed layer is provided on the memory layer via an intermediate layer, and the information is recorded in the memory layer by using a spin torque magnetization inversion generated with a current flowing in a lamination direction to invert magnetization of the memory layer, it is possible to record the information by applying a current in the lamination direction. At this time, since the memory layer includes a multilayer structure layer in which a non-magnetic material and an oxide are laminated, it is possible to decrease the current value that is necessary for inverting the direction of the magnetization of the memory layer.

On the other hand, it is possible to hold the thermal stability of the memory layer sufficiently owing to a strong magnetic anisotropy energy of a perpendicular magnetization film.

From a viewpoint of decreasing an inversion current and ensuring the thermal stability, attention is drawn to the structure using a perpendicular magnetization film as a memory layer. For example, according to Non-Patent Document 3, the possibility of decreasing an inversion current and ensuring the thermal stability by using a perpendicular magnetization film such as a Co/Ni multilayer film as the memory layer is indicated.

Examples of a magnetic material having a perpendicular magnetic anisotropy include a rare earth-transition metal alloy (TbCoFe or the like), a metal multilayer film (Co/Pd multilayer film or the like), an ordered alloy (FePt or the like), and using an interfacial anisotropy between an oxide and magnetic metal (Co/MgO or the like).

However, a material using an interfacial magnetic anisotropy, that is, material in which a magnetic material including Co or Fe is laminated on MgO being a tunnel barrier is promising in view of the adoption of a tunnel junction structure to realize a high magnetoresistance change ratio that provides a large read-out signal in the ST-MRAM, with consideration of heat resistance or easiness in manufacturing.

However, the anisotropy energy of a perpendicular magnetic anisotropy arising from an interfacial magnetic anisotropy is smaller than that of a crystal magnetic anisotropy, a single ion anisotropy, or the like, and is reduced as the thickness of the magnetic layer increases.

In view of the above, in the present disclosure, a ferromagnetic material of the memory layer is a Co—Fe—B layer, and the memory layer is formed to include a laminated structure including an oxide and a non-magnetic layer. Accordingly, the anisotropy in the memory layer is enhanced.

Moreover, according to the configuration of the memory apparatus of the present disclosure, a current in the lamination direction is applied to the memory element through the two types of interconnections and a spin transfer occurs. Thus, it is possible to use a spin torque magnetization inversion to record information by applying a current in the lamination direction of the memory element through the two types of interconnections.

Moreover, because the thermal stability of the memory layer can be sufficiently maintained, it is possible to hold the information stored in the memory element stably, and to realize the miniaturization of the memory apparatus, the improvement of the reliability, and the decrease in the power consumption.

Effect of the Invention

According to the present disclosure, because a memory element having a high perpendicular magnetic anisotropy is obtained, it is possible to configure a memory element having well-balanced properties while ensuring the thermal stability serving as an information holding capacity sufficiently.

Accordingly, it is possible to eliminate the operation error and to obtain an operation margin of the memory element sufficiently. Therefore, it is possible to realize a memory that stably operates with a high reliability.

Moreover, it is possible to decrease the writing current, and to decrease the power consumption when writing is performed on the memory element.

Therefore, it is possible to decrease the power consumption of the entire memory apparatus.

MODE(S) FOR CARRYING OUT THE INVENTION

Hereinafter, an embodiment of the present disclosure will be described in the following order.
<1. Configuration of Memory Apparatus of Embodiment>
<2. Overview of Memory Element of Embodiment>
<3. Specific Configuration of Embodiment>
<4. Experiment>
<5. Modified Example>

1. Configuration of Memory Apparatus of Embodiment

First, the configuration of a memory apparatus serving as an embodiment of the present disclosure will be described.

Figure 1:
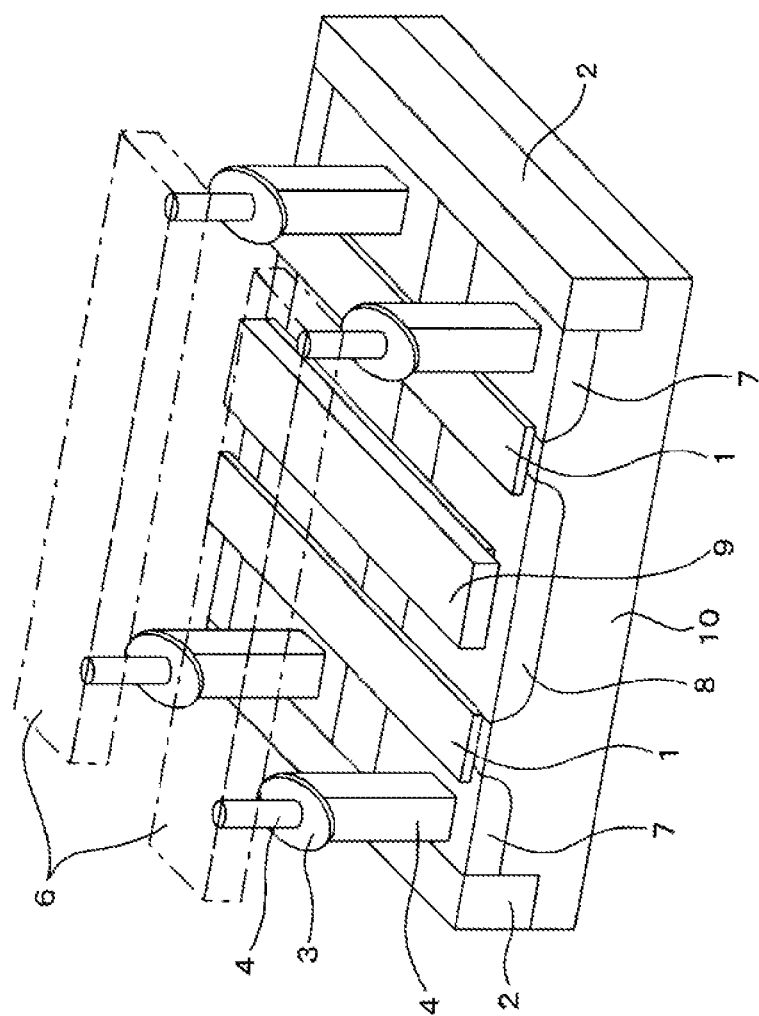
FIG. 1 A structure diagram of a memory apparatus of an embodiment of the present disclosure.
Figure 2:
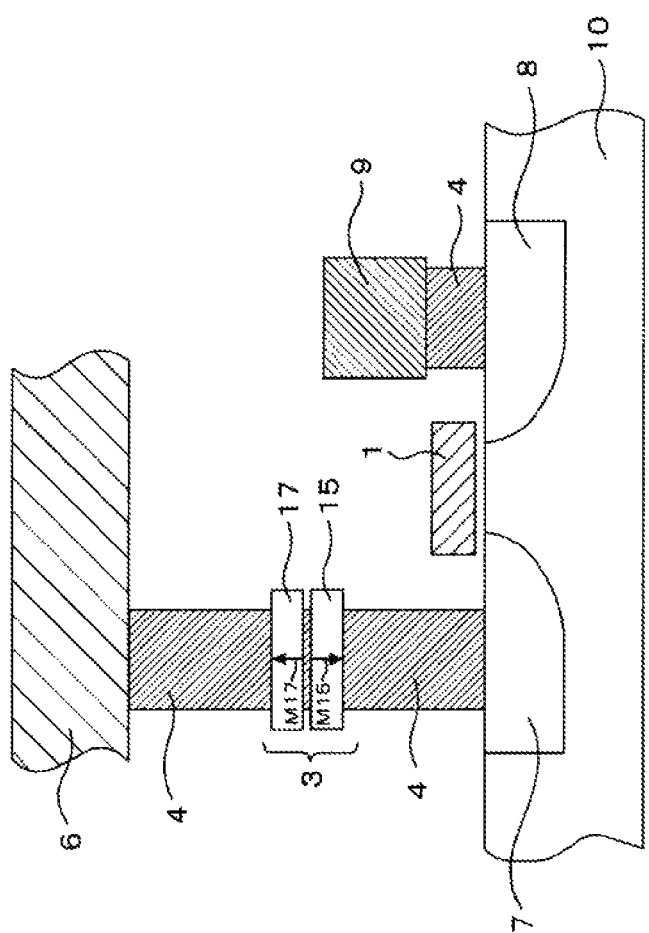
FIG. 2 A cross-sectional view of the memory apparatus of the embodiment.

Schematic diagrams of the memory apparatus of the embodiment are shown in FIG. 1 and FIG. 2. FIG. 1 is a perspective view and FIG. 2 is a cross-sectional view.

As shown in FIG. 1, the memory apparatus of the embodiment includes, for example, a memory element 3 disposed in the vicinity of the intersection point of two types of address interconnections (e.g., a word line and a bit line) perpendicular to each other, which serves as the ST-MRAM and is capable of holding information based on a magnetization state.

That is, a drain area 8, a source area 7, and a gate electrode 1 constituting a transistor for selection that selects each memory apparatus are formed on a portion separated by an element isolation layer 2 of a semiconductor substrate 10 such as a silicon substrate. Of these, the gate electrode 1 serves also as one address interconnection (word line) extending in the back and forth direction in the figure.

The drain region 8 is formed commonly with right and left transistors for selection in FIG. 1, and an interconnection 9 is connected to the drain region 8.

Then, the memory element 3 having a memory layer that inverts a magnetization direction thereof by a spin torque magnetization inversion is disposed between the source region 7 and a bit line 6 that is disposed at an upper side and extends in the right-left direction in FIG. 1. The memory element 3 is configured with, for example, a magnetic tunnel junction element (MTJ element).

As shown in FIG. 2, the memory element 3 has two magnetic layers 15 and 17. In the two magnetic layers 15 and 17, one magnetic layer is set as a magnetization-fixed layer 15 in which the direction of magnetization M15 is fixed, and the other magnetic layer is set as a magnetization-free layer in which the direction of magnetization M17 varies, that is, memory layer 17.

Moreover, the memory element 3 is connected to the bit line 6 and the source region 7 through upper and lower contact layers 4, respectively.

Accordingly, when a current in the vertical direction is applied to the memory element 3 through the two types of address interconnections 1 and 6, the direction of the magnetization M17 of the memory layer 17 can be inverted by a spin torque magnetization inversion.

In such a memory apparatus, it is necessary to perform writing with a current equal to or less than the saturation current of the selection transistor, and it is known that the saturation current of the transistor decreases along with miniaturization. Therefore, in order to miniaturize the memory apparatus, it is favorable that spin transfer efficiency be improved and the current flowing to the memory element 3 be decreased.

Moreover, it is necessary to secure a high magnetoresistance change ratio to amplify a read-out signal. In order to realize this, it is effective to adopt the above-described MTJ structure, that is, to configure the memory element 3 in such a manner that an intermediate layer is used as a tunnel insulating layer (tunnel barrier layer) between the two magnetic layers 15 and 17.

In the case where the tunnel insulating layer is used as the intermediate layer, the amount of the current flowing to the memory element 3 is restricted to prevent the insulation breakdown of the tunnel insulating layer from occurring. That is, it is favorable to restrict the current necessary for the spin torque magnetization inversion from the viewpoint of securing reliability with respect to repetitive writing of the memory element 3. It should be noted that the current necessary for the spin torque magnetization inversion is also called as inversion current, memory current, or the like in some cases.

Moreover, because the memory apparatus is a non-volatile memory apparatus, it is necessary to stably store the information written by a current. That is, it is necessary to secure stability (thermal stability) with respect to thermal fluctuations in the magnetization of the memory layer.

In the case where the thermal stability of the memory layer is not secured, an inverted magnetization direction may be re-inverted due to heat (temperature in an operational environment), which results in a writing error.

The memory element 3 (ST-MRAM) in the memory apparatus is advantageous in scaling compared to the MRAM in the related art, that is, advantageous in that the volume of the memory layer can be small. However, as the volume is small, the thermal stability may be deteriorated as long as other characteristics are the same.

As the capacity increase of the ST-MRAM proceeds, the volume of the memory element 3 becomes smaller, so that it is an important problem to secure the thermal stability.

Therefore, in the memory element 3 of the ST-MRAM, the thermal stability is a significantly important property, and it is necessary to design the memory element in such a manner that the thermal stability thereof is secured even if the volume is decreased.

2. Overview of Memory Element of Embodiment

Next, the overview of the memory element serving as the embodiment of the present disclosure will be described.

The embodiment of the present disclosure records information by inverting the magnetization direction of the memory layer of the memory element by the above-mentioned spin torque magnetization inversion.

The memory layer is composed of a magnetic material including a ferromagnetic layer, and holds the information based on the magnetization state (magnetic direction) of the magnetic material.

Figure 3:
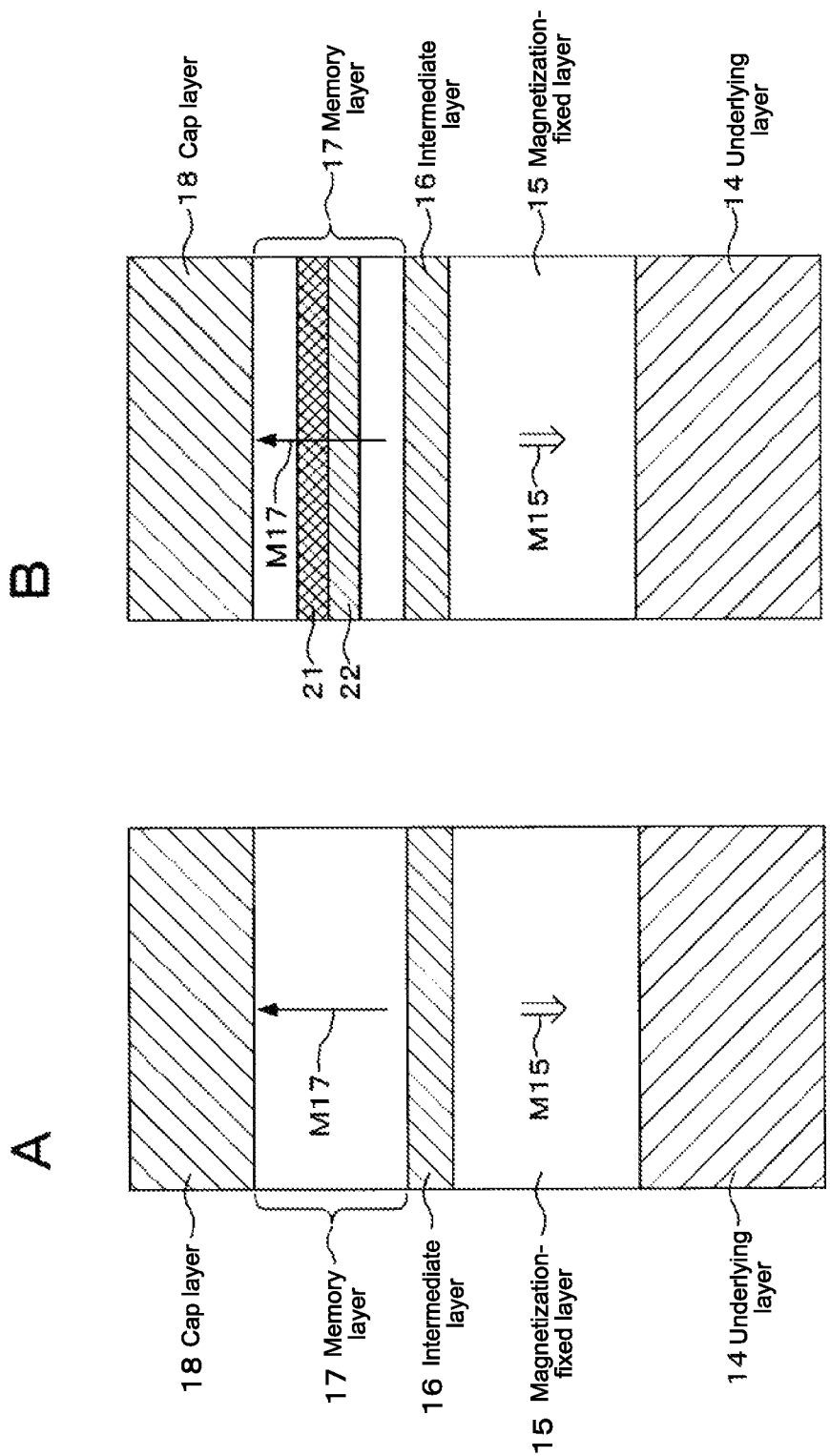
FIG. 3 Diagrams showing a layered structure of respective memory elements of the embodiment.

FIG. 3 show an example of the respective layered structures of the memory elements 3 and 20.

The memory element 3 has a layered structure, for example, as shown in FIG. 3A, and includes the memory layer 17 and the magnetization-fixed layer 15 as the at least two ferromagnetic layers, and an intermediate layer 16 disposed between the two magnetic layers.

The memory layer 17 has magnetization perpendicular to a film face in which the direction of the magnetization is changed corresponding to the information.

The magnetization-fixed layer 15 has magnetization perpendicular to a film face that becomes a base of the information stored in the memory layer 17.

The intermediate layer 16 is formed of a non-magnetic material and is provided between the memory layer 17 and the magnetization-fixed layer 15.

Then, by injecting spin polarized electrons in a lamination direction of the layered structure having the memory layer 17, the intermediate layer 16, and the magnetization-fixed layer 15, the magnetization direction of the memory layer 17 is changed, whereby the information is recorded in the memory layer 17.

Here, the spin torque magnetization inversion will be briefly described.

Electrons have two types of spin angular momentums. The states of the spin are defined temporarily as up and down. The numbers of up spin and down spin electrons are the same in the non-magnetic material, but the numbers of up spin and down spin electrons differ in the ferromagnetic material. In two ferromagnetic layers, i.e., the magnetization-fixed layer 15 and the memory layer 17, constituting the ST-MRAM, the case where the directions of the magnetic moment of each layer are in a reverse direction and the electrons are moved from the magnetization-fixed layer 15 to the memory layer 17 will be considered.

The magnetization-fixed layer 15 is a fixed magnetic layer having the direction of the magnetic moment fixed by high coercive force.

The electrons passed through the magnetization-fixed layer 15 are spin polarized, that is, the numbers of up spin and down spin electrons differs. When the thickness of the intermediate layer 16 that is the non-magnetic layer is made to be sufficiently thin, the electrons reach the other magnetic material, that is, the memory layer 17 before the spin polarization is mitigated by passing through the magnetization-fixed layer 15 and the electrons become a common non-polarized state (the numbers of up spin and down spin electrons are the same) in a non-polarized material.

A sign of the spin polarization in the memory layer 17 is reversed, so that a part of the electrons is inverted for lowering the system energy, that is, the direction of the spin angular momentum is changed. At this time, because the entire angular momentum of the system is necessary to be conserved, a reaction equal to the total angular momentum change by the electron, the direction of which is changed, is applied also to the magnetic moment of the memory layer 17.

In the case where the current, that is, the number of electrons passed through per unit time is small, the total number of electrons, the directions of which are changed, becomes small, so that the change in the angular momentum occurring in the magnetic moment of the memory layer 17 becomes small, but when the current is increased, it is possible to apply large change in the angular momentum within a unit time.

The time change of the angular momentum is a torque, and when the torque exceeds a threshold value, the magnetic moment of the memory layer 17 starts a precession, and rotates 180 degrees due to its uniaxial anisotropy to be stable. That is, the inversion from the reverse direction to the same direction occurs.

When the magnetization directions are in the same direction and the electrons are made to reversely flow from the memory layer 17 to the magnetization-fixed layer 15, the electrons are then reflected at the magnetization-fixed layer 15. When the electrons that are reflected and spin-inverted enter the memory layer 17, a torque is applied and the magnetic moment can be inverted to the reverse direction. However, at this time, the amount of current necessary for causing the inversion is larger than that in the case of inverting from the reverse direction to the same direction.

The inversion of the magnetic moment from the same direction to the reverse direction is difficult to intuitively understand, but it may be considered that because the magnetization-fixed layer 15 is fixed, the magnetic moment cannot be inverted and the memory layer 17 is inverted for conserving the angular momentum of the entire system. Thus, the recording of 0/1 is performed by applying a current having a predetermined threshold value or more, which corresponds to each polarity, from the magnetization-fixed layer 15 to the memory layer 17 or in a reverse direction thereof.

Reading of information is performed by using a magnetoresistive effect similarly to the MRAM in the related art. That is, as is the case with the above-described recording, a current is applied in a direction perpendicular to the film face. Then, a phenomenon in which an electrical resistance shown by the element varies depending on whether or not the magnetic moment of the memory layer 17 is the same or reverse direction to the magnetic moment of the magnetization-fixed layer 15 is used.

A material used for the intermediate layer 16 between the magnetization-fixed layer 15 and the memory layer 17 may be a metallic material or an insulating material, but the insulating material may be used for the intermediate layer to obtain a relatively high read-out signal (resistance change ratio), and to realize the recording by a relatively low current. The element at this time is called a ferromagnetic tunnel junction (Magnetic Tunnel Junction: MTJ) element.

A threshold value Ic of the current necessary to inverse the magnetization direction of the magnetic layer by the spin torque magnetization inversion is different depending on whether an easy axis of magnetization of the magnetic layer is an in-plane direction or a perpendicular direction.

Although the memory elements 3 and 20 of this embodiment are perpendicular magnetization-type, in an in-plane magnetization-type memory element in the related art, the inversion current for inverting the magnetization direction of the magnetic layer is represented by Ic_para.

When the direction is inverted from the same direction to the reverse direction, the equation holds, $Ic\_para = (A \cdot \alpha \cdot Ms \cdot V/g(0)/P)(Hk+2\pi Ms)$. When the direction is inverted from the reverse direction to the same direction, the equation holds, $Ic\_para = -(A \cdot \alpha \cdot Ms \cdot V/g(\pi)/P)(Hk+2\pi Ms)$.

It should be noted that the same direction and the reverse direction denote the magnetization directions of the memory layer based on the magnetization direction of the magnetization-fixed layer, and are also referred to as a parallel direction and a non-parallel direction, respectively.

On the other hand, in the perpendicular magnetization-type memory element according to this example, the inversion current is represented by Ic_perp. When the direction is inverted from the same direction to the reverse direction, the equation holds, $Ic\_perp = (A \cdot \alpha \cdot Ms \cdot V/g(0)/P)(Hk-4\pi Ms)$. When the direction is inverted from the reverse direction to the same direction, the equation holds, $Ic\_perp = -(A \cdot \alpha \cdot Ms \cdot V/g(\pi)/P)(Hk-4\pi Ms)$.

It should be noted that A represents a constant, $\alpha$ represents a damping constant, Ms represents a saturation magnetization, V represents an element volume, P represents a spin polarizability, $g(0)$ and $g(\pi)$ represent coefficients corresponding to efficiencies of the spin torque transmitted to the other magnetic layer in the same direction and the reverse direction, respectively, and Hk represents the magnetic anisotropy.

In the respective equations, when the term (Hk−4 πMs) in the perpendicular magnetization type is compared with the term (Hk+2πMs) in the in-plane magnetization type, it can be understood that the perpendicular magnetization type is suitable to decrease a recording current.

Here, a relationship between an inversion current Ic0 and a thermal stability index Δ is represented by the following (Math. 1).

$$I_C0 = \left(\frac{4ek_BT}{\hbar}\right)\left(\frac{\alpha\Delta}{\eta}\right)$$ [Math. 1]

It should be noted that e represents an electron charge, η represents spin injection efficiency, h with bar represents a decreased Planck constant, α represents a damping constant, $k_B$ represents a Boltzmann constant, and T represents a temperature.

In this embodiment, the memory element includes the magnetic layer (memory layer 17) capable of holding the information based on the magnetization state, and the magnetization-fixed layer 15 in which the magnetization direction is fixed.

It has to hold the written information to exist as a memory. It is judged by the value of the thermal stability index Δ (=KV/$k_B$T) as an index of ability to hold the information. The Δ is represented by the (Math. 2).

$$\Delta = \frac{KV}{k_BT} = \frac{M_SVH_K}{2k_BT}$$ [Math. 2]

Here, Hk represents an effective anisotropic magnetic field, $k_B$ represents a Boltzmann constant, T represents a temperature, Ms represents a saturated magnetization amount, V represents a volume of the memory layer, and K represents the anisotropic energy.

The effective anisotropic magnetic field Hk is affected by a shape magnetic anisotropy, an induced magnetic anisotropy, a crystal magnetic anisotropy and the like. Assuming a single-domain coherent rotation model, this will be equal to coercive force.

The thermal stability index Δ and the threshold value Ic of the current often have the trade-off relationship. Accordingly, in order to maintain the memory characteristics, the trade-off often becomes an issue.

In practice, in a circle TMR element having, for example, the memory layer 17 with a thickness of 2 nm and a plane pattern with a diameter of 100 nm, the threshold value of the current to change the magnetization state of the memory layer is about one hundred to several hundreds of μA.

In contrast, in the normal MRAM that inverts the magnetization using a current magnetic field, the written current exceeds several mA.

Accordingly, in the case of the ST-MRAM, the threshold value of the written current becomes sufficiently low, as described above. Therefore, it can be seen that it is effective to decrease the power consumption of the integrated circuit.

In addition, because the interconnections for generating the current magnetic field used in the normal MRAM are unnecessary, it is advantageous over the normal MRAM in terms of the integration.

Then, when the spin torque magnetization inversion is performed, a current is applied directly into the memory element to write (record) the information. Therefore, in order to select a memory cell to which writing is performed, the memory element is connected to a selection transistor to configure the memory cell.

In this case, the current flowing to the memory element is limited by the amount of the current that can flow to the selection transistor (the saturation current of the selection transistor).

In order to decrease the recording current, the perpendicular magnetization-type is desirably used, as described above. Moreover, the perpendicular magnetization film can generally provide higher magnetic anisotropy than the in-plane magnetization film, and therefore is desirable in that the Δ is kept greater.

Examples of the magnetic material having the perpendicular anisotropy include a rare earth-transition metal alloy (TbCoFe or the like), a metal multilayer film (Co/Pd multilayer film or the like), an ordered alloy (FePt or the like), and using an interfacial anisotropy between an oxide and magnetic metal (Co/MgO or the like). When the rare earth-transition metal alloy is diffused and crystallized by being heated, the perpendicular magnetic anisotropy is lost, and therefore the rare earth-transition metal alloy is not favorable as the ST-MRAM material.

It is known that also the metal multilayer film is diffused when being heated, and the perpendicular magnetic anisotropy is degraded. Because the perpendicular magnetic anisotropy is developed when it has a face-centered cubic (111) orientation, it is difficult to realize a (001) orientation necessary for a high polarizability layer including MgO, and Fe, CoFe, and CoFeB disposed adjacent to MgO. An L10 ordered alloy is stable even at high temperature and shows the perpendicular magnetic anisotropy in the (001) orientation. Therefore, the above-mentioned problem is not induced. However, the L10 ordered alloy has to be heated at sufficiently high temperature of 500° C. or more during the production, or atoms should be arrayed regularly by being heated at a high temperature of 500° C. or more after the production. It may induce unfavorable diffusion or an increase in interfacial roughness in other portions of a laminated film such as a tunnel barrier.

In contrast, the material utilizing interfacial magnetic anisotropy, i.e., the material including MgO being the tunnel barrier and a Co-based or Fe-based material laminated thereon hardly induces any of the above-mentioned problems, and is therefore highly expected as the memory layer material of the ST-MRAM.

However, in order to increase the density of the minute element, it needs to further decrease the power consumption of the entire memory apparatus, particularly, to decrease the writing current, similarly to other materials.

In order to solve this, the writers of the present disclosure created a structure in which the memory layer 17 is formed to include a multilayer structure layer in which a non-magnetic material and an oxide are laminated, as shown in FIG. 3B.

Accordingly, it is possible to obtain the memory element 20 having a high perpendicular magnetic anisotropy, to sufficiently secure the thermal stability, which is an information holding capacity, and to configure the memory element 20 having well-balanced properties.

Moreover, operation errors can be eliminated, and operation margins of the memory element 20 can be sufficiently obtained. Thus, it is possible to realize a memory that stably operates with a high reliability.

Moreover, it is possible to decrease the writing current and to decrease the power consumption when performing writing into the memory element 20.

As a result, it is possible to decrease the power consumption of the entire memory apparatus.

Furthermore, in view of the saturated current value of the selection transistor, as the non-magnetic intermediate layer 16 between the memory layer 17 and the magnetization-fixed layer 15, the magnetic tunnel junction (MTJ) element is configured using the tunnel insulating layer including an insulating material.

This is because by configuring the magnetic tunnel junction (MTJ) element using the tunnel insulating layer, it is possible to make a magnetoresistance change ratio (MR ratio) high compared to a case where a giant magnetoresistive effect (GMR) element is configured using a non-magnetic conductive layer, and to increase the read-out signal strength.

Then, in particular, by using magnesium oxide (MgO) as the material of the intermediate layer 16 serving as the tunnel insulating layer, it is possible to make the magnetoresistance change ratio (MR ratio) high.

Moreover, generally, the spin transfer efficiency depends on the MR ratio, and as the MR ratio is high, the spin transfer efficiency is improved, and therefore it is possible to decrease the magnetization inversion current density.

Therefore, when magnesium oxide is used as the material of the tunnel insulating layer and the memory layer 17 is used, it is possible to decrease the writing threshold current by the spin torque magnetization inversion and therefore it is possible to perform the writing (recording) of information with a small current. Moreover, it is possible to increase the read-out signal strength.

Accordingly, it is possible to decrease the writing threshold current by the spin torque magnetization inversion by securing the MR ratio (TMR ratio), and to perform the writing (recording) of information with a small current. Moreover, it is possible to increase the read-out signal strength.

As described above, in the case where the tunnel insulating layer is formed of the magnesium oxide (MgO) film, it is desirable that the MgO film be crystallized and a crystal orientation be maintained in the (001) direction.

It should be noted that in this embodiment, in addition to a configuration formed of the magnesium oxide, the intermediate layer 16 (tunnel insulating layer) disposed between the memory layer 17 and the magnetization-fixed layer 15 may be configured by using, for example, various insulating materials, dielectric materials, and semiconductors such as aluminum oxide, aluminum nitride, $SiO_2$, $Bi_2O_3$, $MgF_2$, CaF, $SrTiO_2$, $AlLaO_3$, and Al—N—O.

An area resistance value of the tunnel insulating layer has to be controlled to several tens $\Omega\mu m^2$ or less from the viewpoint of obtaining a current density necessary for inverting the magnetization direction of the memory layer 17 by the spin torque magnetization inversion.

Then, in the tunnel insulating layer formed of the MgO film, the film thickness of the MgO film has to be set to 1.5 nm or less so that the area resistance value is in the range described above.

Moreover, in the embodiment of the present disclosure, a cap layer 18 is disposed adjacent to the memory layer 17, and the cap layer may form an oxide layer.

As the oxide of the cap layer 18, MgO, aluminum oxide, $TiO_2$, $SiO_2$, $Bi_2O_3$, $SrTiO_2$, $AlLaO_3$, or Al—N—O may be used, for example.

Moreover, it is desirable to make the memory element small in size to easily invert the magnetization direction of the memory layer 17 with a small current.

Therefore, the area of the memory element is favorably set to 0.01 $\mu m^2$ or less.

It is favorable that the film thickness of each of the magnetization-fixed layer 15 and the memory layer 17 be 0.5 nm to 30 nm.

Other configurations of the memory element may be the same as the configuration of a memory element that records information by the spin torque magnetization inversion in the related art.

The magnetization-fixed layer 15 may be configured in such a manner that the magnetization direction is fixed by only a ferromagnetic layer or by using an antiferromagnetic coupling of an antiferromagnetic layer and a ferromagnetic layer.

Moreover, the magnetization-fixed layer 15 may have a configuration of a single ferromagnetic layer, or a laminated ferri-pinned structure in which a plurality of ferromagnetic layers are laminated via a non-magnetic layer.

As a material of the ferromagnetic layer making up the magnetization-fixed layer 15 having the laminated ferri-pinned structure, Co, CoFe, CoFeB, or the like may be used. Moreover, as a material of the non-magnetic layer, Ru, Re, Ir, Os, or the like may be used.

As a material of the antiferromagnetic layer, a magnetic material such as an FeMn alloy, a PtMn alloy, a PtCrMn alloy, an NiMn alloy, an IrMn alloy, NiO, and $Fe_2O_3$ may be exemplified.

Moreover, magnetic properties may be adjusted by adding a non-magnetic element such as Ag, Cu, Au, Al, Si, Bi, Ta, B, C, O, N, Pd, Pt, Zr, Hf, Ir, W, Mo, and Nb to these magnetic materials, or in addition to this, a crystalline structure or various physical properties such as a crystalline property and a stability of a substance may be adjusted.

Moreover, in relation to a film configuration of the memory element, there is no problem if the memory layer 17 may be disposed at the lower side of the magnetization-fixed layer 15. In this case, the role of the above-described conductive oxide cap layer is made by a conductive oxide underlying layer.

3. Specific Configuration of Embodiment

Next, a specific configuration of the embodiment will be described.

The memory apparatus includes the memory element 3, which is capable of holding information based on a magnetization state, disposed in the vicinity of the intersection point of the two kinds of address interconnections 1 and 6 (e.g., a word line and a bit line) that are perpendicular to each other, as shown in FIGS. 1 and 2.

Then, when a current in the vertical direction is applied to the memory element 3 through the two types of address interconnections 1 and 6, the magnetization direction of the memory layer 17 can be inverted by the spin torque magnetization inversion.

FIGS. 3A and 3B each show an example of the layered structure of the memory element (ST-MRAM) of the embodiment.

As described above, in the memory element 3 shown in FIG. 3A, an underlying layer 14, the magnetization-fixed layer 15, the intermediate layer 16, the memory layer 17, and the cap layer 18 are laminated in the stated order from the lower layer side.

In this case, the magnetization-fixed layer 15 is disposed under the memory layer 17 in which the direction of the magnetization M17 is inverted by the spin injection.

In the spin injection-type memory, "0" and "1" of information are defined by a relative angle between the magnetization M17 of the memory layer 17 and the magnetization M15 of the magnetization-fixed layer 15.

The intermediate layer 16 that serves as a tunnel barrier layer (tunnel insulating layer) is provided between the memory layer 17 and the magnetization-fixed layer 15, and an MTJ element is configured by the memory layer 17 and the magnetization-fixed layer 15. Moreover, the underlying layer 14 is provided under the magnetization-fixed layer 15.

The memory layer 17 is composed of a ferromagnetic material having a magnetic moment in which the direction of the magnetization M17 is freely changed in a direction perpendicular to a layer face. The magnetization-fixed layer 15 is composed of a ferromagnetic material having a magnetic moment in which the magnetization M15 is fixed in a direction perpendicular to a film face.

Information is recorded by the magnetization direction of the memory layer 15 having uniaxial anisotropy. Writing is performed by applying a current in the direction perpendicular to the film face, and inducing the spin torque magnetization inversion. Thus, the magnetization-fixed layer 15 is disposed under the memory layer 15 in which the magnetization direction is inverted by the spin injection, and is to serve as the base of the stored information (magnetization direction) of the memory layer 17.

Because the magnetization-fixed layer 15 is the base of the information, the magnetization direction should not be changed by recording or reading-out. However, the magnetization-fixed layer 15 does not necessarily need to be fixed to the specific direction, and only needs to be difficult to move by increasing the coercive force, the film thickness, or the magnetic damping constant as compared with the memory layer 17.

The intermediate layer 16 is formed of a magnesium oxide (MgO) layer, for example. In this case, it is possible to make a magnetoresistance change ratio (MR ratio) high.

When the MR ratio is thus made to be high, the spin injection efficiency is improved, and therefore it is possible to decrease the current density necessary for inverting the direction of the magnetization M17 of the memory layer 17.

It should be noted that the intermediate layer 16 may be configured by using, for example, various insulating materials, dielectric materials, and semiconductors such as aluminum oxide, aluminum nitride, $SiO_2$, $Bi_2O_2$, $MgF_2$, CaF, $SrTiO_2$, $AlLaO_2$, and Al—N—O, as well as magnesium oxide.

As the underlying layer 14 and the cap layer 18, a variety of metals such as Ta, Ti, W, and Ru and a conductive nitride such as TiN can be used. Moreover, the underlying layer 14 and the cap layer 18 may include a single layer or a plurality of layers in which different materials are laminated.

The structure of the memory element 20 shown in FIG. 3B is different from that of the memory element 3 in the structure of the memory layer 17. The memory layer 17 of the memory element 20 includes a multilayer structure layer in which an oxide layer 22 and a non-magnetic layer 21 are laminated.

Such a multilayer structure layer of the oxide layer 22 and the non-magnetic material layer 21 is not limited to one layer as shown in FIG. 3B, and may be formed of two or more layers.

As the oxide 22, at least one of silicon oxide, magnesium oxide, tantalum oxide, aluminum oxide, cobalt oxide, zirconium oxide, titanium oxide, and chromium oxide can be selected.

As the non-magnetic material, at least one of Cu, Ag, Au, V, Ta, Zr, Nb, Hf, W, Mo, and Cr can be selected.

The memory layer 17 includes a multilayer structure layer formed of the non-magnetic layer 21 and the oxide layer 22, which represents that a heating mechanism in which the temperature rise of the memory layer 17 is increased as compared to a given environment temperature is provided.

Therefore, in the case where the above-mentioned heating mechanism having a high thermal conductivity provides the same temperature rise, the inversion of the magnetization of the memory layer 17 of the memory element 20 according to the embodiment is enhanced and it is possible to decrease the recording current. Furthermore, in a viewpoint of the thermal stability, a magnetic anisotropy is increased and holding properties (capacity to hold information) are improved.

According to the above-described embodiment shown in FIGS. 3A and 3B, particularly, the composition of the memory layer 17 of the memory element is adjusted in such a manner that the magnitude of the effective diamagnetic field that the memory layer 17 receives is smaller than the saturated magnetization amount Ms of the memory layer 17.

In other words, the effective diamagnetic field that the memory layer 17 receives is decreased to be smaller than the saturated magnetization amount Ms of the memory layer 17 by selecting the ferromagnetic material Co—Fe—B composition of the memory layer 17.

The memory elements 3 and 20 of the embodiment can be manufactured by continuously forming from the underlying layer 14 to the cap layer 18 in a vacuum apparatus, and then by forming a pattern of the memory elements 3 and 20 by processing such as etching.

According to this embodiment, because the memory layer 17 of the memory elements 3 and 20 is a perpendicular magnetization film, it is possible to decrease the amount of writing current necessary for inverting the direction of the magnetization M17 of the memory layer 17.

As described above, because the thermal stability, which is an information holding capacity, can be sufficiently secured, it is possible to configure the memory elements 3 and 20 having well-balanced properties.

Accordingly, operation errors can be eliminated, and the operation margins can be sufficiently obtained. Thus, it is possible to cause it to stably operate.

Accordingly, it is possible to realize a memory apparatus that stably operates with a high reliability.

Moreover, it is possible to decrease the writing current and to decrease the power consumption when performing writing.

In particular, in the memory layer 20 including a multilayer structure layer in which the oxide layer 22 and the non-magnetic layer 21 are laminated, because the multilayer structure layer serves as a heating mechanism, the inversion of the magnetization is enhanced and the recording current is decreased. Furthermore, in a viewpoint of the thermal stability, a magnetic anisotropy is increased and holding properties (capacity to hold information) are improved Therefore, it is possible to decrease the power consumption of the entire memory apparatus including the memory elements 3 and 20 of this embodiment.

Moreover, the memory apparatus that includes the memory elements 3 and 20 shown in FIG. 3 and has a configuration shown in FIG. 1 has an advantage in that a general semiconductor MOS forming process may be applied when the memory apparatus is manufactured. Therefore, it is possible to apply the memory apparatus of this embodiment as a general purpose memory.

4. Experiment Regarding Embodiment

Here, in regard to the configuration of the memory elements 3 and 20 of this embodiment shown in FIG. 3A and FIG. 3B, experiments in which samples were prepared and then characteristics thereof were examined were conducted.

The conducted experiments are an experiment 1 and an experiment 2. The experiment 1 was conducted to obtain the temperature change of perpendicular anisotropy. The experiment 2 was conducted to calculate the value of thermal stability index by the measurement of a magnetic resistance curve and to measure the value of an inversion current.

In an actual memory apparatus, as shown in FIG. 1, a semiconductor circuit for switching or the like is present in addition to the memory elements 3 and 20, but here, the examination was conducted on a wafer in which only a memory element is formed in order to check the magnetization inversion properties of the memory layer 17 adjacent to the cap layer 18.

Figure 4:
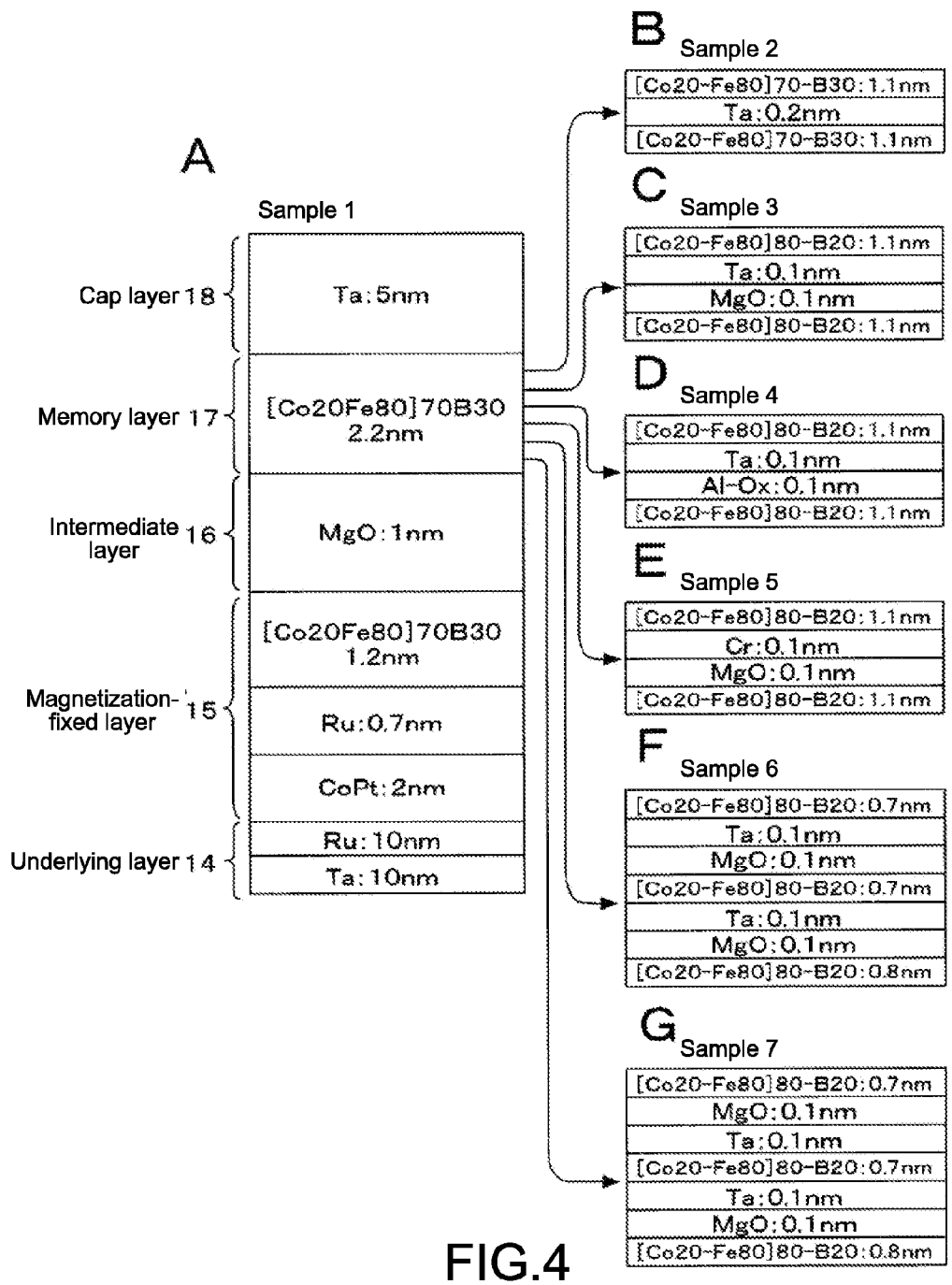
FIG. 4 Diagrams showing a laminated structure of respective samples for experiments of the memory element of the embodiment.

As the sample of a memory element for experiments, as shown in FIG. 4, with the common layers of:

Underlying layer 14: Laminated film of a Ta film having a film thickness of 10 nm and an Ru film having a film thickness of 10 nm;

Magnetization-fixed layer 15: Laminated film of CoPt:2 nm/Ru:0.7 nm/[Co20Fe80]70B30:1.2 nm;

Intermediate layer (tunnel insulating layer) 16: MgO film having a film thickness of 1.0 nm; and Cap layer 18: /Ta:5 nm film/,
the memory layer 17 has the following layered structure, and 7 types of samples are prepared.

As shown in FIG. 4A to G,
Sample 1 (FIG. 4A) Memory layer 17: [Co20Fe80]70B30 having a film thickness of 2.2 nm Sample 2 (FIG. 4B) Memory layer 17: [Co20Fe80]70B30 having a film thickness of 1.1 nm/Ta having a film thickness of 0.2 nm/[Co20Fe80]70B30 having a film thickness of 1.1 nm Sample 3 (FIG. 4C) Memory layer 17: [Co20Fe80]80B20 having a film thickness of 1.1 nm/Layered structure of magnesium oxide having a film thickness of 0.1 nm and Ta having a film thickness of 0.1 nm/[Co20Fe80]80B20 having a film thickness of 1.1 nm Sample 4 (FIG. 4D) Memory layer 17: [Co20Fe80]80B20 having a film thickness of 1.1 nm/aluminum oxide having a film thickness of 0.1 nm and Ta having a film thickness of 0.1 nm/[Co20Fe80]80B20 having a film thickness of 1.1 nm Sample 5 (FIG. 4E) Memory layer 17: [Co20Fe80]80B20 having a film thickness of 1.1 nm/MgO having a film thickness of 0.1 nm and Cr film having a film thickness of 0.1 nm/[Co20Fe80]80B20 having a film thickness of 1.1 nm 6 (FIG. 4F) Memory layer 17: [Co20Fe80]80B20 having a film thickness of 0.8 nm/MgO having a film thickness of 0.1 nm and Ta having a film thickness of 0.1 nm/[Co20Fe80]80B20 having a film thickness of 0.7 nm/MgO having a film thickness of 0.1 nm and Ta having a film thickness of 0.1 nm/[Co20Fe80]80B20 having a film thickness of 0.7 nm Sample 7 (FIG. 4G) Memory layer 17: [Co20Fe80]80B20 having a film thickness of 0.8 nm/MgO having a film thickness of 0.1 nm and Ta having a film thickness of 0.1 nm/Co20Fe80B30 having a film thickness of 0.7 nm/Ta having a film thickness of 0.1 nm and MgO having a film thickness of 0.1 nm/[Co20Fe80]80B20 having a film thickness of 0.7 nm (structure sandwiched from up and down by MgO layers)

A thermally-oxidized film having a thickness of 300 nm was formed on a silicon substrate having a thickness of 0.725 mm, and each sample of the memory element having the above-described configuration was formed thereon. Moreover, a Cu film (to be a word line) having a film thickness of 100 nm, which was not shown, was provided between the underlying layer and the silicon substrate.

Each layer other than the insulating layer was formed using a DC magnetron sputtering method. The insulating layer using an oxide was oxidized in an oxidation chamber after a metal layer was formed using an RF magnetron sputtering method or a DC magnetron sputtering method. After each layer of the memory element was formed, heat treatment was performed at 300° C. for 1 hour in a magnetic field heat treatment furnace.

Experiment 1

This experiment was conducted to obtain the temperature change of perpendicular anisotropy of each sample described above.

The magnetization curve of the memory element is measured by magnetic kerr effect measurement and a Vibrating Sample Magnetometer to obtain the temperature change of the perpendicular anisotropy. For the measurement, not the element after being subject to minute processing but a bulk film portion having a size of about 8 mm×8 mm, which was specially provided on a wafer for magnetization curve evaluation, was used. Moreover, the measurement magnetic field was applied in the direction perpendicular to a film face.

Figure 5:
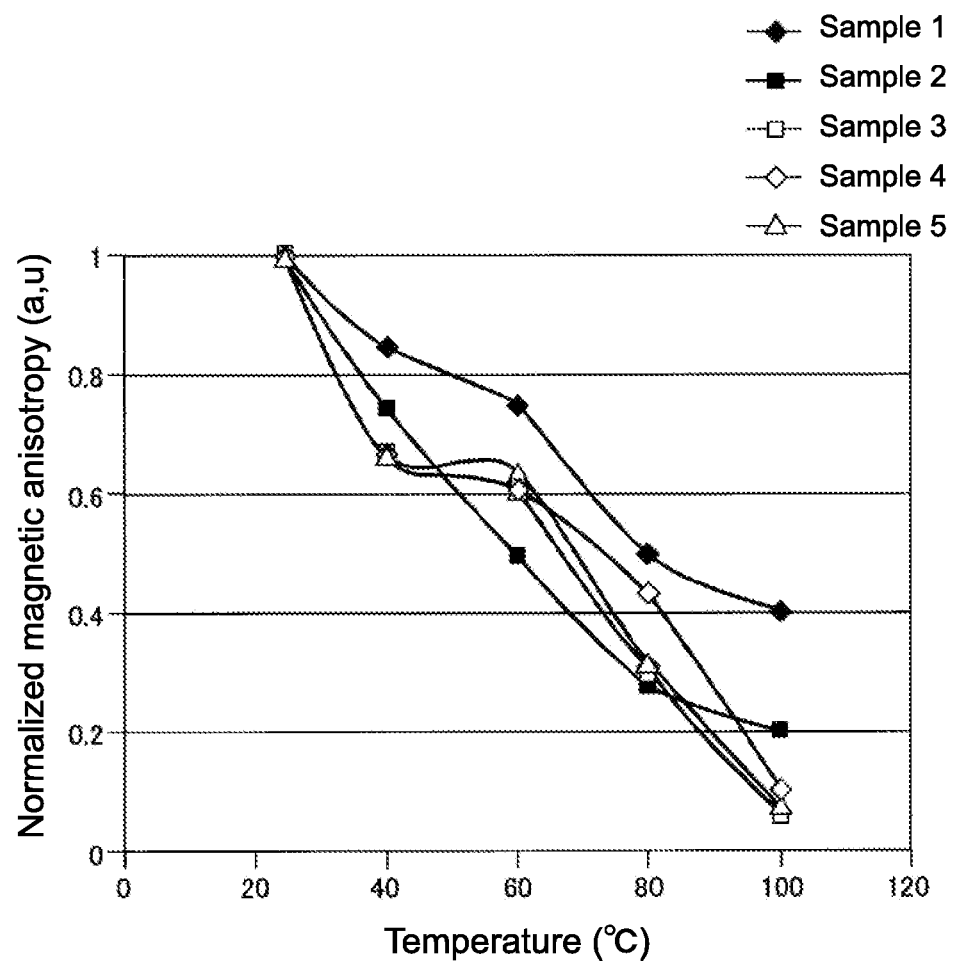
FIG. 5 A diagram showing an experimental result of the temperature change of the magnetic anisotropy in different laminated structures (samples 1 to 5) of the memory element of the embodiment.

FIG. 5 shows the obtained change of the perpendicular magnetic anisotropy of the samples 1 to 5 with respect to environment temperature. The temperature change of the magnetic anisotropy of the sample 2 and the samples 3 to 5 is larger than that of the sample 1. However, even in this case, there is no problem because the perpendicular magnetic anisotropy of the sample 2 and the samples 3 to 5 is sufficiently larger than that of the sample 1.

Moreover, when the sample 2 is compared with the samples 3 to 5, the behavior of the magnetic anisotropy of being larger than that of the sample 2 at the environment temperature of about 60° C. in the example and conversely, being lower than that of the sample 2 at the environment temperature of about 100° C. is observed.

This provides a thought that the multilayer structure layer of the non-magnetic layer and the oxide layer in the memory layer 17 functions as a heating mechanism that increases the temperature rise of the memory layer 17 as compared to a given environment temperature (hereinafter, heater layer).

The reason of the larger temperature rise can be considered as follows. Normally, the non-magnetic layer that functions as the heater layer in the memory layer 17 is distributed in a uniform layer form. Here, it is estimated that if the oxide layer of an ultrashallow film is simultaneously formed in the memory layer 17, the heater layer is distributed by the oxide layer having relatively large concavity and convexity and the surface area thereof that is in contact with the magnetic material in the memory layer 17 is increased, thereby improving the effect as the heater layer.

The principle of the STT-MRAM is based on magnetization inversion by spin torque injection. However, it is estimated that in an actual element, the temperature of the memory layer 17 is increased by 100° C. or more by the current flowing during the inversion. In the case where the samples 3 to 5 in which the heater layer having a high thermal conductivity is introduced are given the same temperature rise as that of a normal element, the magnetization inversion is enhanced because the magnetic anisotropy is significantly changed. Therefore, it is considered possible to decrease the recording current.

Moreover, in a viewpoint of the thermal stability, the samples 3 to 5 in which the heater layer having a high thermal conductivity is introduced have significantly different magnetic anisotropies at about 60° C. Because the interfacial anisotropy of the oxide layer contributes to the perpendicular magnetization in a Co—Fe—B alloy or the like, this further increases the perpendicular magnetic anisotropy in the holding temperature range. From this, it can be said that those in which the heater layer having a high thermal conductivity is introduced have advantages in also the holding properties.

Figure 6:
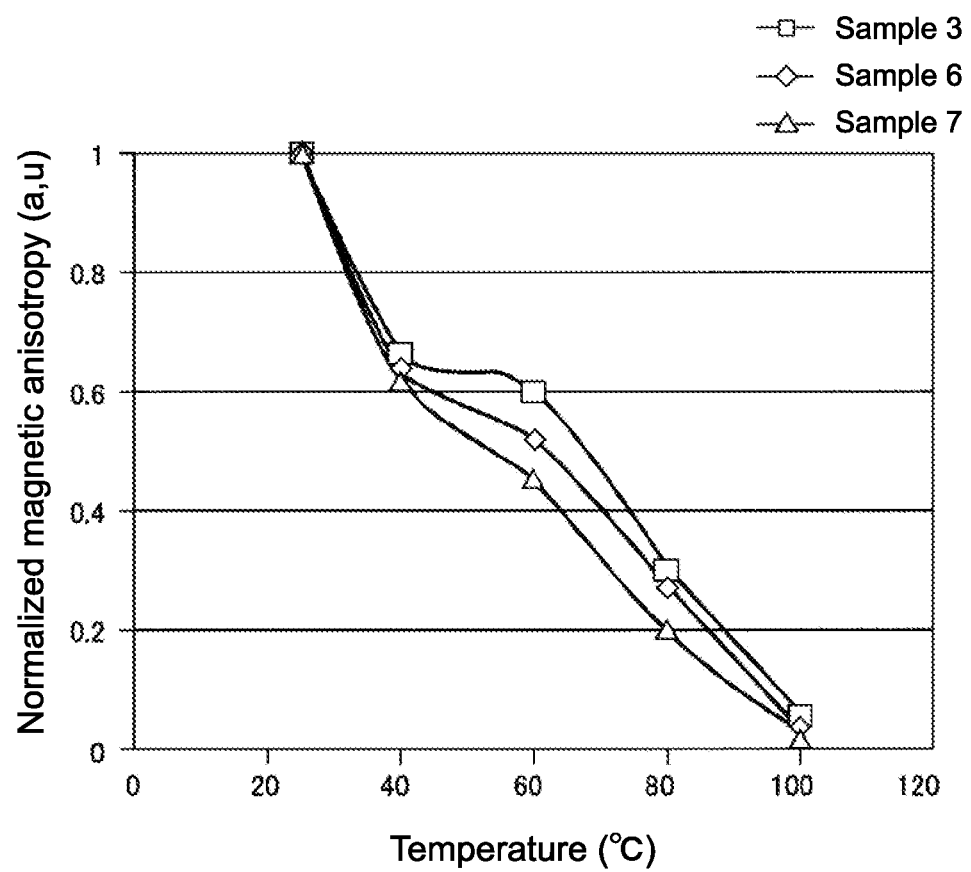
FIG. 6 A diagram showing an experimental result of the temperature change of the magnetic anisotropy in different laminated structures (samples 3, 6, and 7) of the memory element of the embodiment.

Furthermore, a plurality of multilayer structure layers may be formed in the memory layer as a method of enhancing the effect of the heater layer. FIG. 6 shows the temperature change of the perpendicular magnetic anisotropies of the samples 3 and the samples 6 and 7. In the samples 6 and 7 having a plurality of multilayer structure layers of the non-magnetic layer and the oxide layer, the decrease in the perpendicular magnetic anisotropy with respect to the heating temperature is larger and the recording current is expected to be lower than those having one multilayer structure layer.

In addition, in the sample 7, the decrease in the perpendicular magnetic anisotropy is larger than that in the sample 6. This is because the non-magnetic layers (Ta) to be the heater layer are disposed symmetrically with respect to the center of the memory layer and the magnetic material in the memory layer sandwiched between the heater layers is efficiently affected by the plurality of heater layers, in the example 7. It is considered that as a result, the change of the perpendicular magnetic anisotropy of the entire memory layer is increased.

As a result of various studies, if the multilayer structure layer of the non-magnetic layer and the oxide layer is formed, the effect of the heater layer can be efficiently exerted.

The material of the non-magnetic layer can be selected from at least one of Cu, Ag, Au, V, Ta, Zr, Nb, Hf, W, Mo, and Cr, and, on the other hand, the oxide layer can be selected from at least one of silicon oxide, magnesium oxide, tantalum oxide, aluminum oxide, cobalt oxide, zirconium oxide, titanium oxide, and chromium oxide. Moreover, in the experiment, the composition of CO—Fe—B may be changed from about 20 to 40% from a viewpoint of the TMR value or the heat resistance.

Experiment 2

In this experiment, in order to evaluate the writing properties of the memory element, the calculation of the value of the thermal stability index by the measurement of the magnetoresistance curve and the measurement of the inversion current value are performed in each sample described above.

A current with a pulse width of 10 μs to 100 ms was applied to the memory element, and the subsequent resistance value of the memory element was measured. Furthermore, the amount of currents applied to the memory element was changed, and the current value at which the direction of the magnetization of the memory layer of the memory element is inverted was obtained.

Moreover, the distribution of the coercive force obtained by measuring the magnetoresistance curve of the memory element a plurality of times corresponds to the index (Δ) of the holding properties (thermal stability) of the memory element. As the measured distribution of the coercive force is less, a higher Δ value is obtained. Then, in order to take into account the variability between memory elements, about 20 memory elements having the same configuration were prepared, and the above-mentioned measurement was performed. Thus, the inversion current value and the average value of the index Δ of the thermal stability were obtained.

TABLE 1

|  | Index of thermal stability (Δ) | Inversion current (MA/cm$^2$) |
| --- | --- | --- |
| Sample 1 | 28 | 4.2 |
| Sample 2 | 45 | 4.1 |
| Sample 6 | 48 | 3.7 |
| Sample 7 | 45 | 3.5 |

In Table 1, evaluation of the magnetization inversion properties in writing by a current in the samples 1, 2, 6, and 7 was collected. A difference in the thermal stabilities is caused between the samples 1 and 2 by reflecting the adjustment of the magnetic properties due to the existence or non-existence of the non-magnetic layer.

In the samples 6 and 7, the inversion current density is decreased by about 10% while maintaining the thermal stability, which exemplifies the results of the experiment 1. In the sample 7 particularly, it is considered that because the magnetic material in the memory layer sandwiched between the heater layers by the lamination adding layer is intensively heated, the temperature dependency of the anisotropy of the portion is further increased and the magnetization is inverted preferentially.

Furthermore, the inverted layer transmits the inversion over the entire memory layer via the magnetic coupling, thereby further decreasing the inversion current density.

The additional laminated structure of the non-magnetic layer and the oxide layer is not limited to the laminated structure in the samples 6 and 7 and may be changed in the effective range shown in the experiment 1.

Moreover, the underlying layer 14 or the cap layer 18 may include a single material or may have a laminated structure of a plurality of materials.

Moreover, the magnetization-fixed layer 15 may be a single layer or may have a laminated ferri-pinned structure including two ferromagnetic layers and a non-magnetic layer. Moreover, it may have a structure obtained by adding an anti-ferromagnetic film to a laminated ferri-pinned structure film.

5. Modified Example

The memory element 3 or the memory element 20 of the present disclosure has a configuration of the magnetoresistive effect element such as a TMR element. The magnetoresistive effect element as the TMR element can be applied to a variety of electronic apparatuses, electric appliances, an the like including a magnetic head, a hard disk drive equipped with the magnetic head, an integrated circuit chip, a personal computer, a portable terminal, a mobile phone, and a magnetic sensor device, as well as the above-described memory apparatus.

Figure 7:
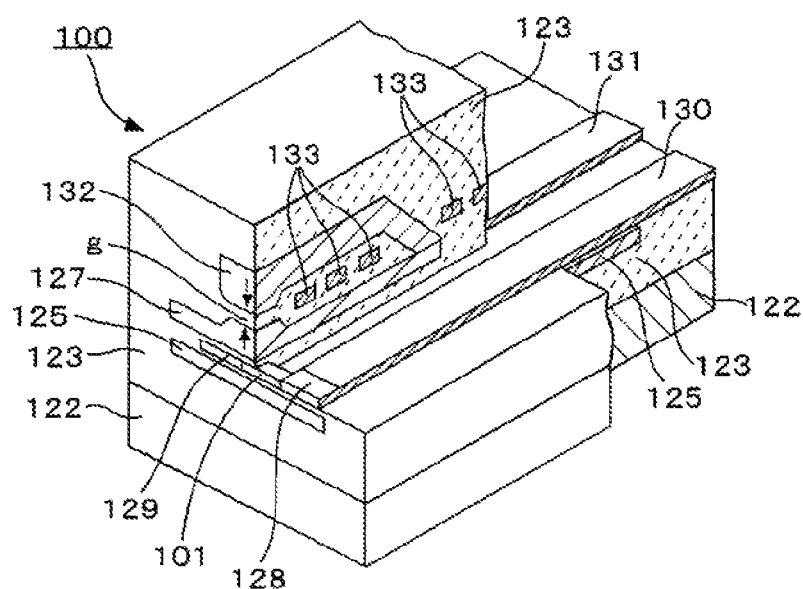
FIG. 7 Explanatory diagrams of examples of applying a magnetic head of the embodiment.
Figure 7:
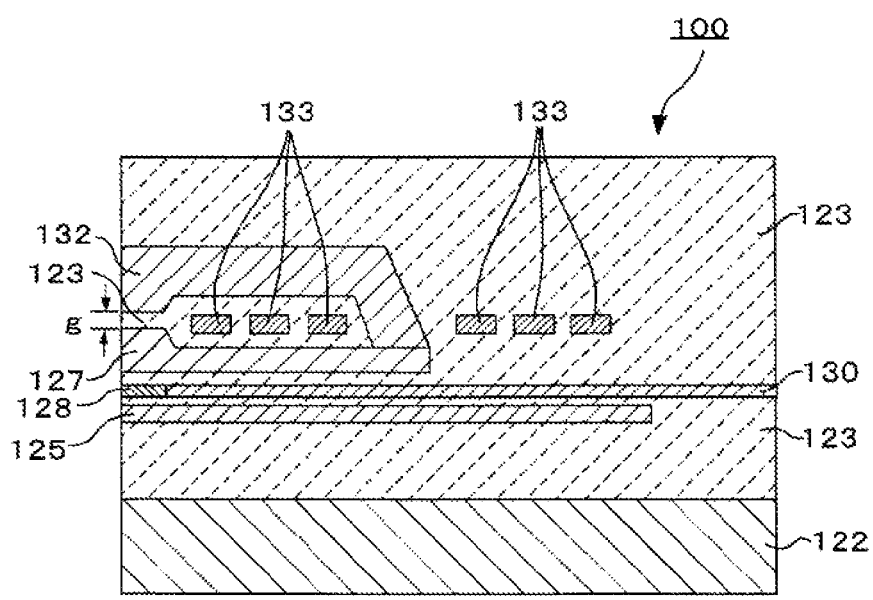

As an example, FIGS. 7A and 7B each show an application of a magnetoresistive effect element 101 having the structure of the above-described memory elements 3 and 20 to a composite magnetic head 100. It should be noted that FIG. 7A is a perspective view shown by cutting some parts of the composite magnetic head 100 for discerning the internal configuration, and FIG. 7B is a cross-sectional view of the composite magnetic head 100.

The composite magnetic head 100 is a magnetic head used for a hard disk apparatus or the like, and is obtained by forming the magnetoresistive effect magnetic head to which the technique of the present disclosure is applied on a substrate 122. On the magnetoresistive effect magnetic head, an inductive magnetic head is laminated and thus the composite magnetic head 100 is formed. Here, the magnetoresistive effect magnetic head operates as a reproducing head, and the inductive magnetic head operates as a recording head. That is, the composite magnetic head 100 is configured by combining the reproducing head and the recording head.

The magnetoresistive effect magnetic head mounted on the composite magnetic head 100 is a so-called shielded MR head, and includes a first magnetic shield 125 formed on the substrate 122 via an insulating layer 123, the magnetoresistive effect element 101 formed on the first magnetic shield 125 via the insulating layer 123, and a second magnetic shield 127 formed on the magnetoresistive effect element 101 via the insulating layer 123. The insulating layer 123 includes an insulating material such as $Al_2O_3$ and $SiO_2$.

The first magnetic shield 125 is for magnetically shielding a lower side of the magnetoresistive effect element 101, and includes a soft magnetic material such as Ni—Fe. On the first magnetic shield 125, the magnetoresistive effect element 101 is formed via the insulating layer 123.

The magnetoresistive effect element 101 functions as a magnetosensitive element for detecting a magnetic signal from the magnetic recording medium in the magnetoresistive effect magnetic head. Then, the magnetoresistive effect element 101 may have the similar film configuration to the above-described memory element 3 or the memory element 20.

The magnetoresistive effect element 101 is formed in an almost rectangular shape, and has one side that is exposed to an opposite surface of the magnetic recording medium. Then, at both ends of the magnetoresistive effect element 101, bias layers 128 and 129 are disposed. Moreover, connection terminals 130 and 131 that are connected to the bias layers 128 and 129 are formed. A sense current is supplied to the magnetoresistive effect element 101 via the connection terminals 130 and 131.

Furthermore, above the bias layers 128 and 129, the second magnetic shield 127 is disposed via the insulating layer 123.

The inductive magnetic head laminated and formed on the above-described magnetoresistive effect magnetic head includes a magnetic core including the second magnetic shield 127 and an upper core 132, and a thin film coil 133 formed so as to be wound around the magnetic core.

The upper core 132 forms a closed magnetic path together with the second magnetic shield 122, is to be the magnetic core of the inductive magnetic head, and includes a soft magnetic material such as Ni—Fe. Here, the second magnetic shield 127 and the upper core 132 are formed such that front end portions thereof are exposed to an opposite surface of the magnetic recording medium, and the second magnetic shield 127 and the upper core 132 come into contact with each other at back end portions thereof. Here, the front end portions of the second magnetic shield 127 and the upper core 132 are formed at the opposite surface of the magnetic recording medium such that the second magnetic shield 127 and the upper core 132 are spaced apart by a predetermined gap g.

That is, in the composite magnetic head 100, the second magnetic shield 127 not only magnetically shields the upper layer side of the magnetoresistive effect element 126, but functions as the magnetic core of the inductive magnetic head. The second magnetic shield 127 and the upper core 132 configure the magnetic core of the inductive magnetic head. Then, the gap g is to be a recording magnetic gap of the inductive magnetic head.

In addition, above the second magnetic shield 127, thin film coils 133 buried in the insulation layer 123 are formed. Here, the thin film coils 133 are formed to wind around the magnetic core including the second magnetic shield 127 and the upper core 132. Although not shown, both ends of the thin film coils 133 are exposed to the outside, and terminals formed on the both ends of the thin film coil 133 are to be external connection terminals of the inductive magnetic head. That is, when a magnetic signal is recorded on the magnetic recording medium, a recording current will be supplied from the external connection terminals to the thin film coil 132.

The composite magnetic head 121 as described above is equipped with the magnetoresistive effect magnetic head as the reproducing head. The magnetoresistive effect magnetic head is equipped, as the magnetosensitive element that detects a magnetic signal from the magnetic recording medium, with the magnetoresistive effect element 101 to which the technology of the present disclosure is applied. Then, as the magnetoresistive effect element 101 to which the technology of the present disclosure is applied shows the excellent properties as described above, the magnetoresistive effect magnetic head can achieve further high recording density of magnetic recording.

It should be noted that the present disclosure may also have the following configurations.

(1) A memory element, including
a layered structure including
a memory layer having magnetization perpendicular to a film face in which a direction of the magnetization is changed depending on information, the memory layer including a multilayer structure layer in which a non-magnetic material and an oxide are laminated, the direction of the magnetization of the memory layer being changed by applying a current in a lamination direction of the layered structure to record the information in the memory layer,
a magnetization-fixed layer having magnetization perpendicular to the film face, which becomes a base of the information stored in the memory layer, and
an intermediate layer that is formed of a non-magnetic material and is provided between the memory layer and the magnetization-fixed layer.

(2) The memory element according to (1) above, in which the non-magnetic material includes at least one of Cu, Ag, Au, V, Ta, Zr, Nb, Hf, W, Mo, and Cr.

(3) The memory element according to (1) or (2) above, in which
the oxide includes at least one of silicon oxide, magnesium oxide, tantalum oxide, aluminum oxide, cobalt oxide, zirconium oxide, titanium oxide, and chromium oxide.

(4) The memory element according to any one of (1) to (3) above, in which at least two multilayer structure layers including the non-magnetic material and the oxide are formed in the memory layer.
(5) The memory element according to any one of (1) to (4) above, in which
a ferromagnetic material forming the memory layer is Co—Fe—B.

DESCRIPTION OF REFERENCE NUMERALS 1 gate electrode
2 element isolation layer
3 memory element
4 contact layer
6 bit line
7 source area
8 drain area
9 interconnection
10 semiconductor substrate
14 underlying layer
15 magnetization-fixed layer
16 intermediate layer
17 memory layer
18 cap layer
21 oxide layer
22 non-magnetic layer
100 composite magnetic head
122 substrate
123 insulating layer
125 first magnetic shield
127 second magnetic shield
128 129 bias layer
130 131 connection terminal
132 upper core
133 thin film coil

The invention claimed is:
1. A memory element, comprising:
(a) a memory layer having magnetization perpendicular to a film face of the memory layer and parallel to a thickness direction of the memory element in which a direction of the magnetization is changeable, the memory layer comprising two ferromagnetic material layers between which is a multilayer structure in which a non-magnetic layer and a non-magnetic oxide layer are in direct contact with each other, the direction of the magnetization of the memory layer being changeable by applying a current in the thickness direction of the memory element to record information in the memory layer, the two ferromagnetic material layers comprising a same ferromagnetic material and having the same direction of magnetization,
(b) a magnetization-fixed layer having a fixed magnetization perpendicular to the film face and parallel to the thickness direction of the memory element, and
(c) an intermediate layer comprising a non-magnetic material between the memory layer and the magnetization-fixed layer,
wherein,
the non-magnetic layer is in direct contact with one of the ferromagnetic layers and the non-magnetic oxide layer is in direct contact with the other of the ferromagnetic layers, and
the non-magnetic layer is a metallic material layer and not an oxide layer.
2. The memory element according to claim 1, wherein the non-magnetic layer of the memory layer includes at least one element selected from the group consisting of Cu, Ag, Au, V, Ta, Zr, Nb, Hf, W, Mo, and Cr.
3. The memory element according to claim 1, wherein the non-magnetic oxide layer includes at least one selected from the group consisting of silicon oxide, magnesium oxide, tantalum oxide, aluminum oxide, cobalt oxide, zirconium oxide, titanium oxide, and chromium oxide.
4. The memory element according to claim 1, wherein the memory layer further comprises a third ferromagnetic layer, a second non-magnetic layer and a second non-magnetic oxide layer are in direct contact and positioned between the third ferromagnetic layer and one of the other ferromagnetic layers.
5. The memory element according to claim 4, wherein the second non-magnetic layer is in direct contact with the one of the other ferromagnetic layers and the second non-magnetic oxide layer is in direct contact with the third ferromagnetic layer.
6. The memory element according to claim 4, wherein the second non-magnetic layer is in direct contact with the third ferromagnetic layer and the second non-magnetic oxide layer is in direct contact with the one of the other ferromagnetic layers.
7. The memory element according to claim 1, wherein the ferromagnetic material of the memory layer is a composition of Co, Fe, and B.
8. The memory element according to claim 1, wherein the multilayer structure is configured such that a thickness of the non-magnetic layer is equal to a thickness of the non-magnetic oxide layer.
9. The memory element according to claim 1, wherein the two ferromagnetic material layers have a same thickness.
10. A memory apparatus, comprising:
(i) a memory element that holds information based on a magnetization state of a magnetic material, the memory element including
(a) a memory layer having magnetization perpendicular to a film face of the memory layer and parallel to a thickness direction of the memory element in which a direction of the magnetization is changeable, the direction of the magnetization of the memory layer being changeable by applying a current in the thickness direction of the memory element to record information in the memory layer, the memory layer comprising two ferromagnetic material layers between which is a multilayer structure in which a non-magnetic layer and a non-magnetic oxide layer are in direct contact with each other and laminated, the two ferromagnetic material layers comprising a same ferromagnetic material and having the same direction of magnetization,
(b) a magnetization-fixed layer having a fixed magnetization perpendicular to the film face and parallel to the thickness direction of the memory element, and
(c) an intermediate layer comprising a non-magnetic material between the memory layer and the magnetization-fixed layer; and
(ii) two types of interconnections intersecting with each other, the memory layer being disposed between the two types of interconnections, the current being applied to the memory element through the two types of interconnections,
wherein,
the non-magnetic layer is in direct contact with one of the ferromagnetic layers and the non-magnetic oxide layer is in direct contact with the other of the ferromagnetic layers, and the non-magnetic layer is a metallic material layer and not an oxide layer.

11. The memory apparatus according to claim 10, wherein the non-magnetic layer of the memory layer includes at least one element selected from the group consisting of Cu, Ag, Au, V, Ta, Zr, Nb, Hf, W, Mo, and Cr.

12. The memory apparatus according to claim 10, wherein the non-magnetic oxide layer includes at least one selected from the group consisting of silicon oxide, magnesium oxide, tantalum oxide, aluminum oxide, cobalt oxide, zirconium oxide, titanium oxide, and chromium oxide.

13. The memory apparatus according to claim 10, wherein the memory layer further comprises a third ferromagnetic layer, a second non-magnetic layer and a second non-magnetic oxide layer are in direct contact and positioned between the third ferromagnetic layer and one of the other ferromagnetic layers.

14. The memory apparatus according to claim 10, wherein the ferromagnetic material of the memory layer is a composition of Co, Fe, and B.

* * * * *